(12) United States Patent
Huang et al.

(10) Patent No.: US 9,395,632 B2
(45) Date of Patent: **\*Jul. 19, 2016**

(54) EFFICIENT SOLUTION FOR REMOVING EUV NATIVE DEFECTS

(71) Applicant: Taiwan Semiconductor Manufacturing Co., Ltd., Hsin-Chu (TW)

(72) Inventors: Yen-Kai Huang, Hsinchu (TW); Hsun-Chuan Shih, Hsinchu County (TW); Yuan-Chih Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 56 days.

This patent is subject to a terminal disclaimer.

(21) Appl. No.: 14/454,755

(22) Filed: Aug. 8, 2014

(65) Prior Publication Data

US 2015/0378251 A1    Dec. 31, 2015

Related U.S. Application Data

(60) Provisional application No. 62/018,718, filed on Jun. 30, 2014.

(51) Int. Cl.
| | |
|---|---|
| *G01N 21/00* | (2006.01) |
| *G03B 27/32* | (2006.01) |
| *G03B 27/54* | (2006.01) |
| *G03F 1/00* | (2012.01) |
| *G03F 7/20* | (2006.01) |
| *G03F 1/22* | (2012.01) |
| *G03F 1/44* | (2012.01) |
| *G03F 1/84* | (2012.01) |

(52) U.S. Cl.
CPC .............. *G03F 7/70591* (2013.01); *G03F 1/22* (2013.01); *G03F 1/44* (2013.01); *G03F 7/70433* (2013.01); *G03F 1/84* (2013.01)

(58) Field of Classification Search
CPC ............ G03F 1/0092; G03F 1/14; G03F 1/22; G03F 1/24; G03F 1/38; G03F 1/44; G03F 1/84; G03F 7/70433; G03F 7/70591; G01M 11/005
USPC ................ 355/67, 77; 356/124, 237.4, 237.5; 430/5, 22, 30; 716/52, 55
See application file for complete search history.

(56) References Cited

PUBLICATIONS

Yi, et al. "High Sensitivity Actinic Detection of Native Defects on Extreme Ultraviolet Lithography Mask Blanks." American Vacuum Society, J. Vac. Sci. Technol. B 19(6), Nov./Dec. 2001.
U.S. Appl. No. 13/952,846, filed Jul. 29, 2013.
U.S. Appl. No. 14/030,926, filed Sep. 18, 2013.

*Primary Examiner* — Colin Kreutzer
(74) *Attorney, Agent, or Firm* — Eschweiler & Associates, LLC

(57) ABSTRACT

The present disclosure relates to a method and apparatus for mitigating printable native defects in an extreme ultra violet (EUV) mask substrate. In some embodiments, the method is performed by providing an EUV mask substrate having a multi-layer coating disposed over a low thermal expansion material. The sizes of one or more native defects within the EUV mask substrate are measured and printable native defects having a measured size that violates one or more sizing thresholds are identified. A position at which a patterned absorber material is to be formed over the multi-layer coating is determined. The position minimizes a number printable native defects that interact with EUV radiation during an EUV lithography process. By mitigating a number of printable native defects violating the one or more sizing thresholds, the process window of an EUV reticle formed from the EUV mask substrate is improved.

20 Claims, 7 Drawing Sheets

EFFICIENT SOLUTION FOR REMOVING EUV NATIVE DEFECTS

CROSS REFERENCE TO RELATED APPLICATIONS

This application is a Non-Provisional Patent Application claiming priority to U.S. Provisional Patent Application Ser. No. 62/018,718 filed on Jun. 30, 2014 entitled "EFFICIENT SOLUTION FOR REMOVING EUV NATIVE DEFECTS" in the name of Yen-Kai Huang, et al. and is incorporated herewith by reference.

BACKGROUND

Photolithography is a process by which a reticle having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet lithography (EUVL), which uses extreme ultraviolet (EUV) light having an exposure wavelength of between 10 nm and 130 nm, is a promising next-generation lithography solution for emerging technology nodes (e.g., 32 nm, 22 nm, etc.).

EUVL is performed using a reflective reticle that selectively reflects EUV radiation onto a light sensitive photoresist material. A mask substrate used to form an EUVL reflective reticle consists of a low thermal expansion material that is coated with a plurality of reflective layers (Mo/Si multi-layers) configured to reflect EUV radiation. A patterned absorber layer is disposed over the reflective layers. The patterned absorber layer is configured to selectively absorb EUV radiation, such that the reflected EUV radiation exposes the light sensitive photoresist material in a desired pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
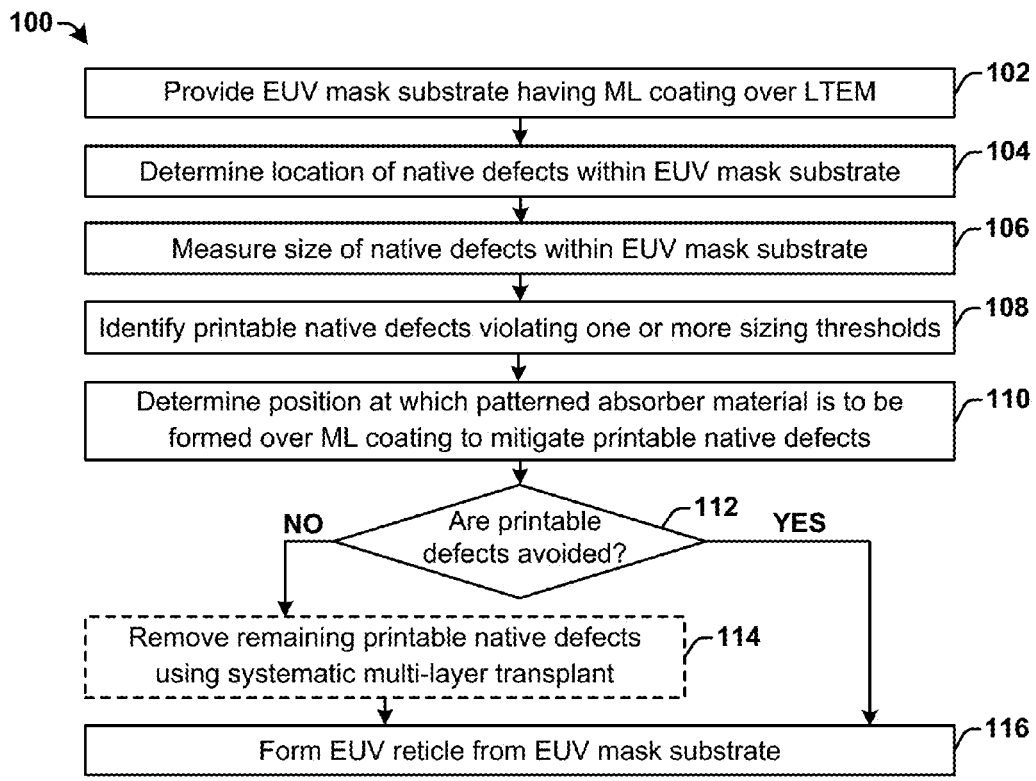
FIG. 1 is a flow diagram of some embodiments of a method of mitigating printable native defects in an extreme ultraviolet (EUV) mask substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet lithography (EUVL) utilizes reflective EUV reticles having a patterned absorber material disposed over a multi-layer reflective coating formed on a low thermal expansion material (LTEM). EUV reticles may have various native defects that introduce fabrication defects in integrated chip features. In EUV reticles, native defects can occur in the patterned absorber material, the multi-layer reflective coating, and/or in the LTEM. For example, pits and bulges in the LTEM can lead to defects in the overlying multi-layer reflective coating. Because of the extremely short exposure wavelength (e.g., 13.5 nm), such defects can affect the amplitude (e.g., cause a change in local reflectivity) and phase (e.g., cause a change in the reflected electric field) of EUV radiation reflected from an EUV reticle and can significantly reduce the process window for printing on-chip features.

Compensation methods may be utilized to mitigate native defects in an EUV mask substrate used to form an EUV reticle. For example, native defects can be mitigated by attempting to form the patterned absorber material over the native defects. Since the patterned absorber material absorbs incident EUV radiation, the EUV radiation will not interact with the native defects underlying patterned absorber material, thereby preventing the defects from affecting the reflected EUV radiation. However, the pattern of the absorber material is dictated by an integrated chip design and may not be able to cover some native defects. Alternatively, native defects can be mitigated by a multi-layer transplant, in which a section of the EUV mask substrate containing a defect is removed and replaced with a defect free multi-layer (ML) replacement section of an EUV mask substrate (i.e., a multi-layer replacement cake). However, such defect free ML replacement sections are formed using a focus ion beam, which provides for a low throughput and can reduce the consistency of the defect free ML replacement sections.

Accordingly, the present disclosure relates to a method and apparatus for mitigating printable native defects in an extreme ultra violet (EUV) mask substrate. In some embodiments, the method is performed by providing an EUV mask substrate having a multi-layer reflective coating disposed over a low thermal expansion material. The sizes of one or more native defects within the EUV mask substrate are measured and printable native defects having a measured size that violates one or more sizing thresholds are identified. A position at which a patterned absorber material is to be formed over the multi-layer reflective coating is determined. The position minimizes a number of printable native defects that interact with EUV radiation during an EUV lithography process. By mitigating a number of printable native defects violating the one or more sizing thresholds, the process window of an EUV reticle formed from the EUV mask substrate is improved.

FIG. 1 is a flow diagram of some embodiments of a method 100 of mitigating printable native defects in an extreme ultraviolet (EUV) mask substrate.

At 102, an extreme ultraviolet (EUV) mask substrate having one or more native defects is provided. The EUV mask substrate includes a multi-layer (ML) reflective coating having a plurality of reflective layers, which is disposed over a low thermal expansion material (LTEM). In some embodiments, the one or more native defects may be caused by particles that are disposed on the LTEM substrate, imbedded in the ML reflective coating (e.g., during deposition process of the film), or imbedded on a top of ML reflective coating after deposition. In other embodiments, the one or more native defects may be a pit or scratch in the LTEM substrate or the ML reflective coating.

At 104, locations of native defects within the EUV mask substrate are determined. In some embodiments, the locations of the native defects may be determined from a defect map provided by a manufacturer of the EUV mask substrate or generated by a mask inspection tool (e.g., an optical scanning inspection tool, an atomic force microscopy (AFM), etc.).

At 106, sizes of native defects within EUV mask substrate are measured. In some embodiments, the sizes of the native defects may be measured using an atomic force microscope (AFM), for example. In some embodiments, the sizes of the native defects may be correlated to process window hotspots of a resulting patterned semiconductor substrate to determine one or more sizing thresholds, in some embodiments. The one or more sizing thresholds define a size at which native defects degrade a process window of an associated lithography process.

At 108, one or more printable native defects having a measured size that violates one or more sizing thresholds are identified. In some embodiments, the one or more sizing thresholds may be a height or diameter of a native defect. In other embodiments, the one or more sizing thresholds may be a position of the native defect relative to an integrated chip design shape or feature.

At 110, one or more positions at which a patterned absorber material is to be formed over the ML reflective coating are determined. The one or more positions of the patterned absorber material are configured to prevent printable native defects, violating the one or more sizing thresholds, from affecting a process window of a reticle formed from the EUV mask substrate. For example, the absorber material may be formed to have a pattern (that is based upon IC design layout) positioned within the mask substrate so that printable native defects are hidden underneath the patterned absorber material. When the absorber material is patterned on the mask substrate in a subsequent operation, the hidden printable native defects will have no impact on an EUV lithography process.

At 112, remaining printable native defects that are not mitigated by the absorber material and that violate the one or more sizing thresholds are identified. If no remaining printable native defects are identified, than method 100 proceeds to act 116. If remaining printable native defects are identified, than method 100 proceeds to act 114.

At 114, remaining printable native defects are removed using a systematic multi-layer transplant procedure. The systematic multi-layer transplant procedure uses a dry etching process to remove one or more multi-layer (ML) sections of the EUV mask substrate comprising the remaining printable native defects that violate the one or more sizing thresholds and to form one or more defect-free multi-layer (ML) replacement sections. It then inserts the defect-free ML replacement sections into the EUV mask substrate at positions of the removed one or more ML sections.

At 116, an EUV reticle is formed from the EUV mask substrate. The EUV reticle may be subsequently used in an integrated chip fabrication process.

Figure 2:
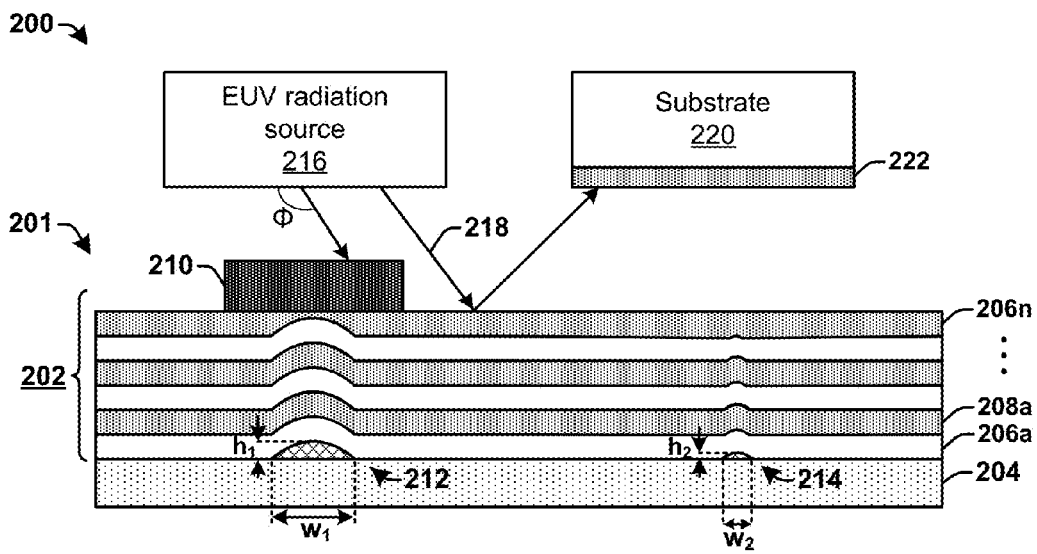
FIG. 2 illustrates a block diagram of some embodiments of an EUV mask substrate including a printable native defect and an unprintable native defect.

FIG. 2 illustrates a block diagram of some embodiments of an EUVL system 200 comprising an EUV reticle having mitigated printable native defects.

The EUVL system 200 includes an EUV radiation source 216 (e.g., a synchrotron, a plasma source, etc.) configured to generate EUV radiation 218 having a wavelength in the extreme ultraviolet section of the electromagnetic spectrum. The EUV radiation 218 is provided to an EUV reticle 201 configured to reflect the EUV radiation 218 to a photosensitive coating 222 (e.g., a photoresist layer) overlying a semiconductor substrate 220, so as to form a pattern in the photosensitive coating 222.

The EUV reticle 201 includes a reflective multi-layer (ML) reflective coating 202 having a plurality of reflective layers 206a . . . 206n disposed over a low thermal expansion material (LTEM) 204 (e.g., a quartz substrate or low-thermal-expansion glass substrate). The plurality of reflective layers 206a . . . 206n are separated from one another by a plurality of spacer layers 208a . . . 208n to form a dielectric mirror configured to reflect the EUV radiation 218 by means of constructive multi-interlayer interference between the reflective and spacer layers, 206 and 208. The plurality of reflective layers 206a . . . 206n may comprise molybdenum (Mo) or ruthenium (Ru) and the plurality of spacer layers 208a . . . 208n may comprise silicon (Si). A patterned absorber material 210 configured to absorb (i.e., attenuate) the EUV radiation 218 is disposed over the ML reflective coating 202. In some embodiments, a buffer layer (not shown) may be disposed between the ML reflective coating 202 and the patterned absorber material 210. The buffer layer is configured to act as a capping layer to prevent oxidation of the top reflective layer 206n (e.g., molybdenum) by exposure to an ambient environment.

The EUV reticle 201 has a printable native defect 212 and an unprintable native defect 214. The printable native defect 212 has a first size defined by a first width $w_1$ and a first height $h_1$. The first size of the printable native defect 212 is large enough to degrade images printed by the EUV reticle 201. The unprintable native defect 214 has a second size defined by a second width $w_2$ and a second height $h_2$. The second size of the unprintable native defect 214 is small enough that it does not degrade images printed by the EUV reticle 201. Therefore, to prevent the native defects, 212 and 214, from influencing the EUV radiation 218, the patterned absorber material 210 is disposed over ML reflective coating 202 at a position that overlies printable native defect 212 (i.e., that violates one or more sizing thresholds), but which does not overlie unprintable native defect.

It will be appreciated that although the patterned absorber material 210 is shown as overlying the printable native defect 212, in some embodiments, the patterned absorber material may not be directly over a printable native defect. This is because the EUV radiation source 216 applies EUV radiation 218 to the EUV reticle 201 at an incline φ (e.g., usually 6°), which may affect the position of the patterned absorber material 210. Furthermore, although native defects, 212 and 214, are illustrated in FIG. 2 as protruding shapes (e.g., bumps extending out from the LTEM as a positive relief), the method and apparatus provided herein are not limited to such defects. In other embodiments, the method and apparatus may be used to mitigate defects comprising recessed shapes (e.g., pits extending into the LTEM as a negative relief).

Figure 3:
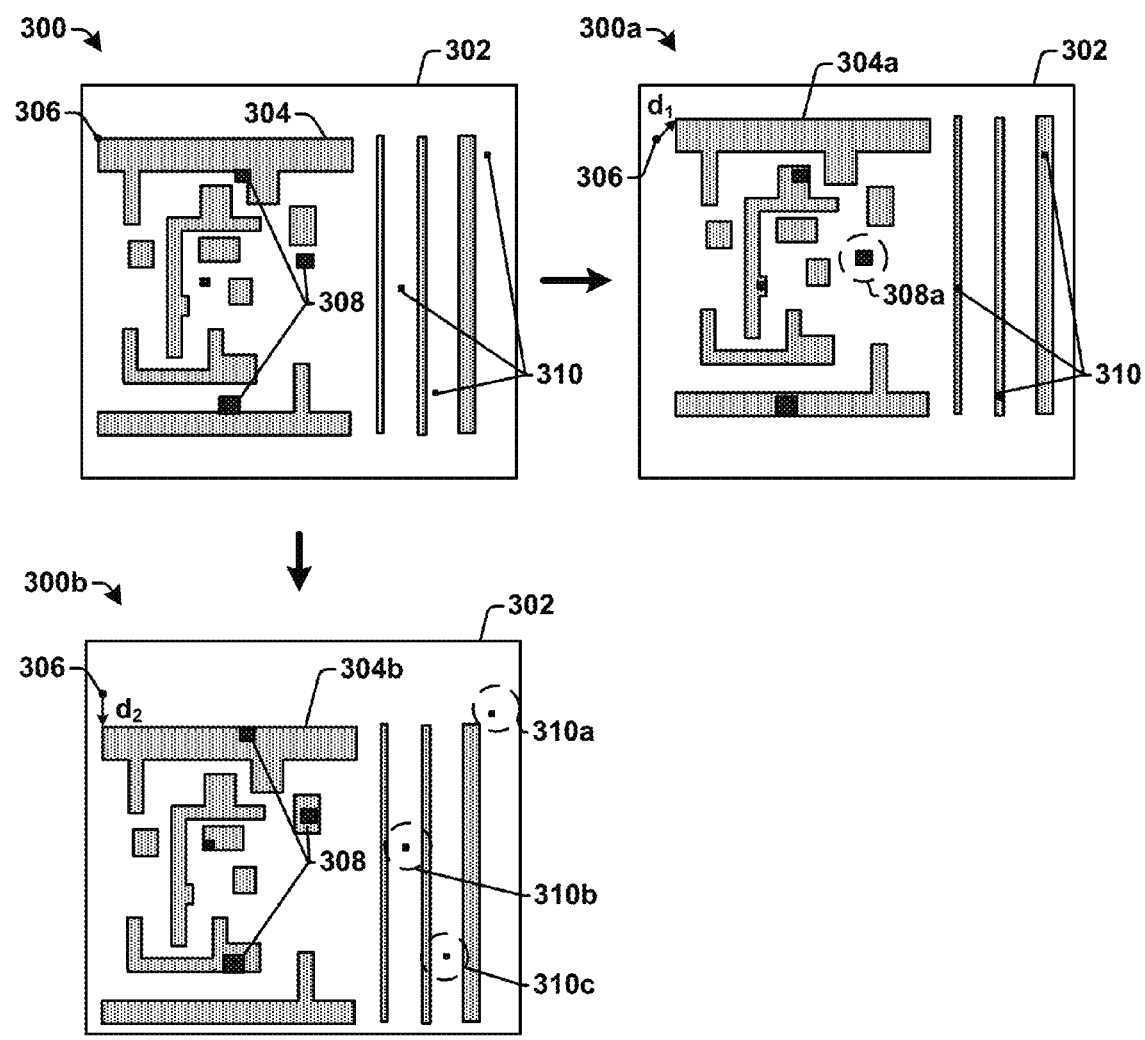
FIG. 3 illustrates block diagrams of some embodiments of EUV mask substrates illustrating a method of minimizing printable native defects.

FIG. 3 illustrates block diagrams of some embodiments of EUV reticles that show how printable native defects can be minimized by changing the position of a patterned absorber material.

EUV reticle 300 includes an EUV mask substrate having a patterned absorber material 304 overlying a multi-layer (ML) reflective coating 302 having a plurality of reflective layers. The patterned absorber material 304 is formed into a pattern based upon an IC design layout (e.g., stored in a GDSII file). The patterned absorber material 304 is located at an initial position, having an upper left corner at an origin point 306, which is not influence by printable native defects 308 or unprintable native defects 310. Forming the patterned absorber material 304 at the initial position results in a plurality of printable and unprintable native defects, 308 and 310, which are not covered by the patterned absorber material 304. Such a plurality of uncovered printable native defects 308 will degrade the process window of the EUV reticle 300.

EUV reticle 300a includes an EUV mask substrate having a shifted patterned absorber material 304a (having the pattern based upon the IC design layout) overlying ML reflective coating 302. The patterned absorber material 304a is located at a first shifted position, having an upper left corner that is shifted from origin point 306 by a distance $d_1$. The first shifted position is selected to maximize a total number of printable and unprintable native defects, 308 and 310, covered by the patterned absorber material 304a. Forming the patterned absorber material 304a at the first shifted position results in a printable native defect 308a that is not covered by the patterned absorber material 304a. Since printable native defect 308a violates the one or more sizing thresholds it will degrade the process window of EUV reticle 300a.

EUV reticle 300b includes an EUV mask substrate having a shifted patterned absorber material 304b (having the pattern based upon the IC design layout) overlying ML reflective coating 302. The patterned absorber material 304b is located at a second shifted position, having an upper left corner that is shifted from origin point 306 by a distance $d_2$. The second shifted position is selected to maximize a number of printable native defects 308 covered by the patterned absorber material 304b. Forming the patterned absorber material 304b at the second shifted position mitigates the printable native defects 308 violating the one or more sizing thresholds, but results in a plurality of unprintable native defect 310a-310c that are not covered by the patterned absorber material 304b. Since the unprintable native defect 310a-310c will not negatively impact the process window of EUV reticle 300b, the resulting process window of EUV reticle 300b is better than that of EUV reticles 300 or 300a.

Figure 4:
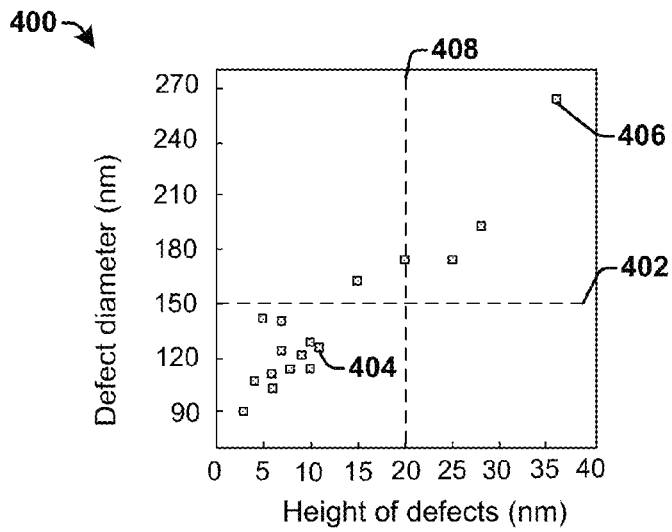
FIG. 4 is a graph showing some embodiments of sizing thresholds of printable native defects.

FIG. 4 is a graph 400 showing some embodiments of one or more sizing thresholds of printable native defects determined from a correlation between the size of a plurality of native defects and process window hotspots of a resulting patterned semiconductor substrate.

Graph 400 shows a measured diameter of native defects on the y-axis and a measured height of native defects on the x-axis. Threshold line 402 corresponds to a diameter sizing threshold. Native defects that violate the threshold line 402 are printable native defects that will degrade the optical properties of an EUV reticle and result in process window hotspots on a resulting patterned semiconductor substrate. For example, measured native defect 404 has a diameter below threshold line 402 and therefore is not a printable native defect. In contrast, native defect 406 has a diameter above threshold line 402 and therefore is a printable native defect In some embodiments, threshold line 402 may be located at approximately 150 nm. In such embodiments, native defects in an EUV mask substrate having a diameter larger than 150 nm will form an EUV reticle that causes one or more process window hotspots on a resulting patterned semiconductor substrate. To mitigate the process window hotspots, method 100 would attempt to form the patterned absorber material over a maximum number of printable native defects that have a diameter greater than or equal to approximately 150 nm.

Threshold line 408 corresponds to a height sizing threshold. Native defects that violate the threshold line 408 are printable native defects that will degrade the optical properties of an EUV reticle and result in process window hotspots on a resulting patterned semiconductor substrate. For example, in some embodiments, threshold line 408 may be located at approximately 20 nm. In such embodiments, native defects in an EUV mask substrate having a height larger than 20 nm will form an EUV reticle that causes one or more process window hotspots on a resulting patterned semiconductor substrate. To mitigate the process window hotspots, method 100 would attempt to form the patterned absorber material over a maximum number of printable native defects that have a height greater than or equal to approximately 20 nm.

In some embodiments, one or more additional sizing thresholds may be implemented separately or in conjunction with those shown in graph 400. For example, in some embodiments, the one or more sizing thresholds may be a position of the native defect relative to an integrated chip (IC) design shape. In such embodiments, native defects that are less than a predetermined distance (e.g., 500 nm) from an IC design shape are printable native defects that will degrade the optical properties of an EUV reticle and result in process window hotspots on a resulting patterned semiconductor substrate.

Figure 5:
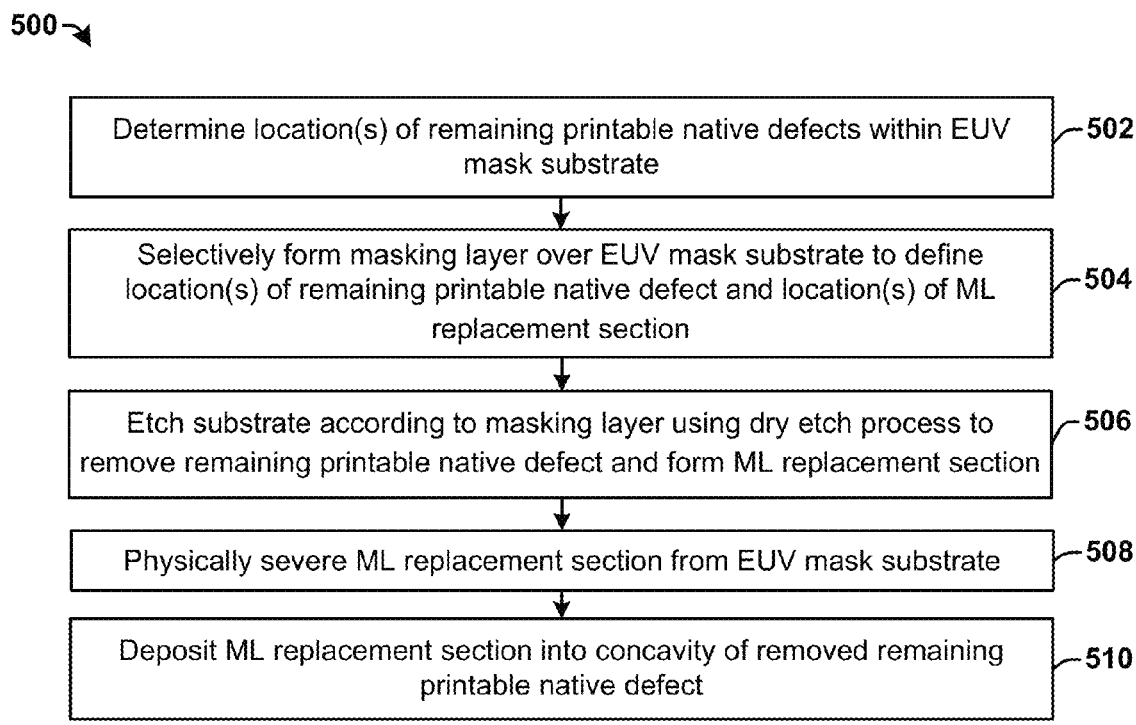
FIG. 5 is a flow diagram of some embodiments of a method of performing a systematic multi-layer transplant procedure.

FIG. 5 is a flow diagram of some embodiments of a method 500 of forming a performing a systematic multi-layer transplant procedure.

While the disclosed methods (e.g., method 100, 500, and/or 900) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, one or more locations of remaining printable native defects are determined within an EUV mask substrate. The remaining printable defects violate the one or more sizing thresholds and are not prevented from interacting with EUV radiation by the patterned absorber material (e.g., are not covered by the patterned absorber material).

At 504, a masking layer is selectively formed over EUV mask substrate to define one or more locations of the remaining printable native defect(s) and one or more locations of multi-layer (ML) replacement section(s).

At 506, the EUV mask substrate is selectively etched according to the masking layer using a dry etching process. Selectively etching the EUV mask substrate according to the dry etching process exposes the EUV mask substrate to a dry etchant configured to removes a first section of the EUV mask substrate comprising a remaining printable native defect to form a concavity within the EUV mask substrate. It also prepares a ML replacement section (i.e., a multi-layer replacement cake) in a different area of the EUV mask substrate, wherein the replacement section is devoid of printable native defects. In some embodiments, the dry etching process may comprise an RF (radio frequency) plasma etching process. In some embodiments, the RF plasma etching process may use an etchant chemistry including chlorine and fluorine.

At 508, the ML replacement section is physically severed from the EUV mask substrate.

At 510, the ML replacement section is deposited into the concavity formed at the location of the removed defect.

FIGS. 6A-9 show illustrations of some embodiments of an EUV mask substrate corresponding to a method of performing a systematic multi-layer transplant procedure. It will be appreciated that although FIGS. 6A-9 are described with respect to a method 500, the illustrations are not limited such a method, but instead may stand alone as apparatus.

Figure 6A:
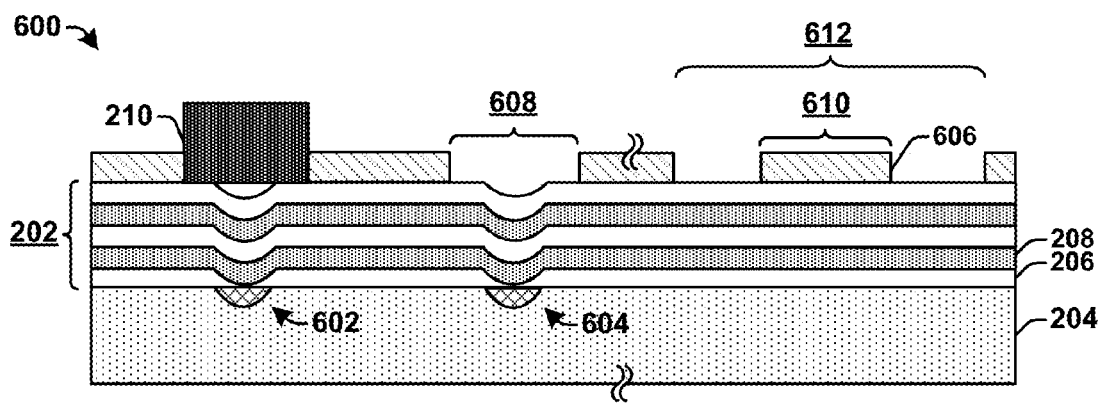
FIGS. 6A-9 show illustrations of some embodiments of an EUV substrate corresponding to a method of performing a systematic multi-layer transplant procedure.

FIG. 6A illustrates a cross-sectional view 600 of some embodiments of an EUV mask substrate corresponding to acts 502-504.

As shown in cross-sectional view 600, the EUV mask substrate has a first printable native defect 602 and a second printable native defect 604. Patterned absorber material 210 is disposed over a ML reflective coating 202 at a position at that prevents EUV radiation from interacting with the first printable native defect 602. However, patterned absorber material 210 is not disposed over the ML reflective coating 202 at a position at that prevents EUV radiation from interacting with the second printable native defect 604. Therefore, the second printable native defect 604 is a remaining printable native defect.

A masking layer 606 is selectively formed over the ML reflective coating 202. The masking layer 606 is configured to define a first section 608 of the EUV mask substrate including the remaining printable native defect 604. The masking layer 606 is further configured to define a multi-layer (ML) replacement section 610 (i.e., a multi-layer replacement cake) within a replacement section preparation area 612 of the EUV mask substrate. In various embodiments, the first section 608 may have a substantially same size as the ML replacement section 610 or a slightly smaller size than the ML replacement section 610.

In some embodiments, the masking layer 606 may comprise a layer of photoresist. In such embodiments, the layer of photoresist may be exposed using an electron beam (e-beam) writer. The exposed photoresist material is subsequently developed to remove weaker sections of the exposed photoresist material.

Figure 6B:
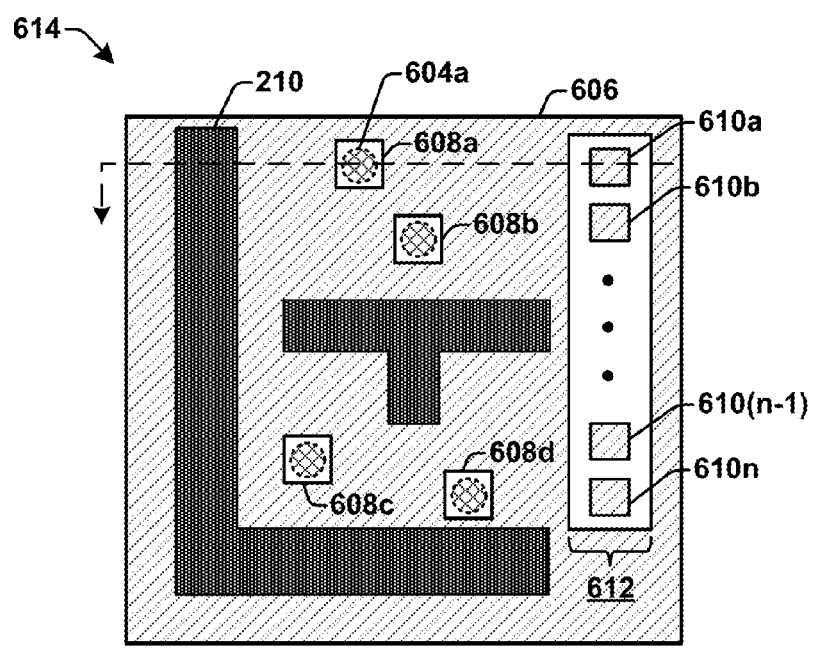

FIG. 6B illustrates a top-view 614 corresponding to cross-sectional view 600 of the EUV mask substrate. As shown in top-view 614, in some embodiments, the masking layer 606 may be configured to define a plurality of ML replacement sections 610a . . . 610n located within the replacement section preparation area 612 of the EUV mask substrate, which is outside of the patterned absorber material 210.

Figure 7A:
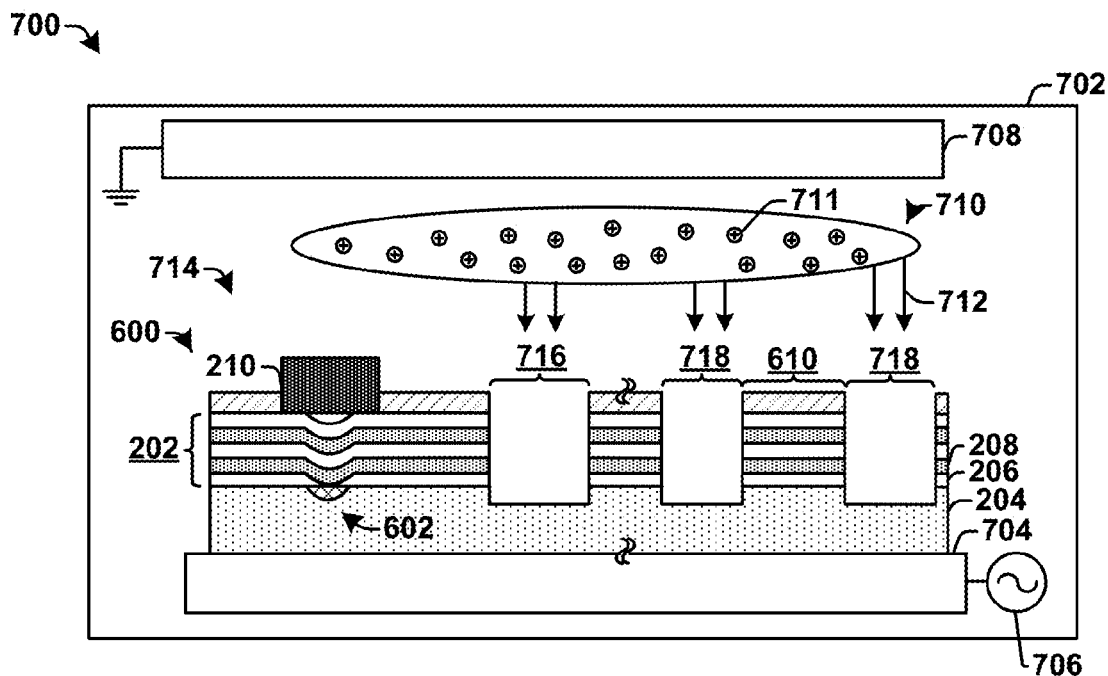

FIG. 7A illustrates a cross-sectional view 700 of some embodiments of an EUV mask substrate corresponding to act 506.

As shown in cross-sectional view 700, the EUV mask substrate is provided onto a wafer platform comprising a first electrode 704 within a processing chamber 702 of an RF plasma dry etcher. The first electrode 704 is coupled to a RF signal generator 706. A grounded second electrode 708 is located within the processing chamber 702 on a side of the EUV mask substrate that opposes the first electrode 704. During operation, the RF signal generator 706 is configured to provide an RF signal (e.g., a voltage oscillating at 13.56 MHz) to the first electrode 704. The RF signal causes the first electrode 704 to generate an electromagnetic field that forms a plasma cloud 710 by ionizing (e.g., stripping electrons from) gas molecules within the processing chamber 702. A large negative voltage builds up on the first electrode 704, causing positive ions 711 from the plasma cloud 710 to be accelerated to the negative voltage of the first electrode 704 as an ion plasma etchant 712.

The ion plasma etchant 712 is configured to selectively etch the ML reflective coating 202 according to the masking layer 606. The ion plasma etchant has removed the first section 608 and form a concavity 716 within the EUV mask substrate. The concavity 716 extends to a position within the EUV mask substrate that is sufficient to remove the second printable native defect (e.g., 604). For example, in some embodiments, the concavity 716 may extend from a top surface of the ML reflective coating 202 to a position within the LTEM 204. In some embodiments, the concavity 716 may have an anisotropic etching profile with substantially vertical sidewalls. The ion plasma etchant 712 has also formed a trench 718 around the ML replacement section 610. The trench 718 is configured to free the multi-layer (ML) replacement section from the EUV mask substrate.

Figure 7B:
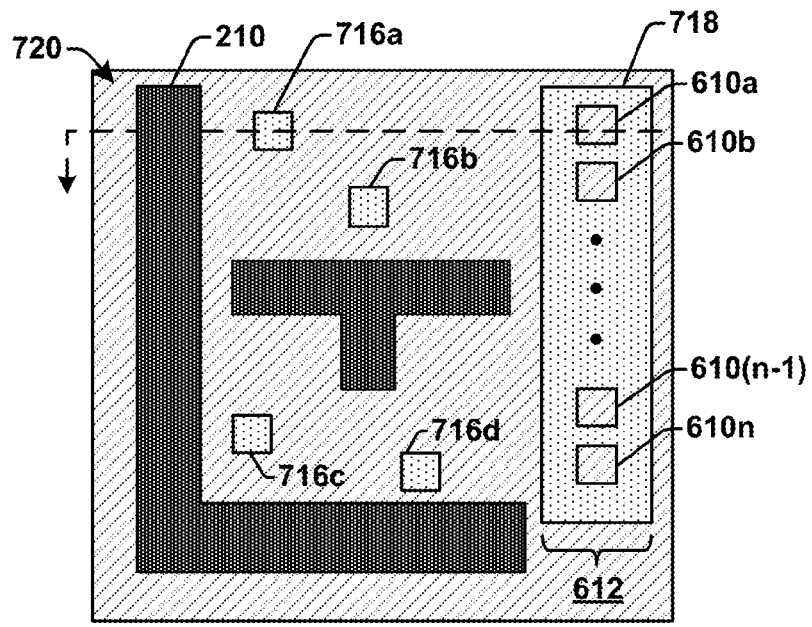

FIG. 7B illustrates a top-view 720 of the EUV mask substrate corresponding to cross-sectional view 700. As shown in top-view 720, the trench 718 extends around a plurality of ML replacement sections 610a . . . 610n, which have been concurrently formed within the replacement section preparation area 612. The plurality of replacement sections 610a . . . 610n may be subsequently transferred to different concavities 712a . . . 712d within the EUV mask substrate. In some embodiments, the plurality of replacement sections 610a . . . 610n may have different sizes (e.g., a first replacement section may have a first size, a second replacement section may have a second size different than the first size, etc.).

FIGS. 8A-8D illustrate cross-sectional views of some embodiments of an EUV mask substrate corresponding to act 508.

Figure 8A:
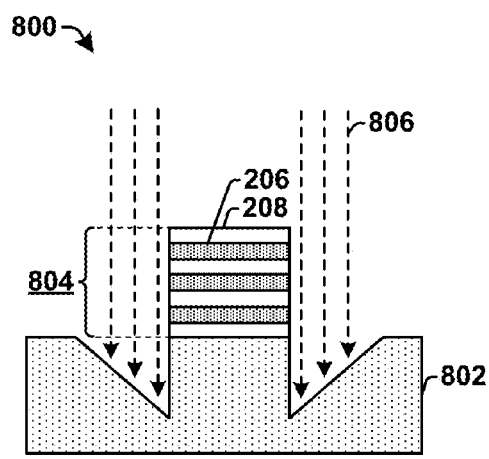

FIG. 8A shows a cross-sectional view 800 illustrating the selective removal of material of the LTEM 802 in areas surrounding a ML replacement section 804. In some embodiments, material of the LTEM 802 may be removed using a focused ion beam 806 (e.g., a focused beam of comprising gallium ions). In some embodiments, the focused ion beam 806 may form triangular recesses within the LTEM 802, which are disposed along opposing sides of the ML replacement section 804.

Figure 8B:
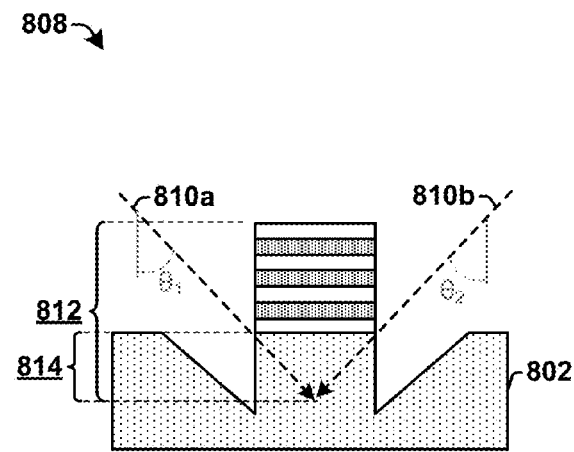

FIG. 8B shows a cross-sectional view 808, in which the ML replacement section 812 is severed from the LTEM 802. In some embodiments, the ML replacement section 812 is severed from the LTEM 802 using one or more focused ion beams 808 configured to cut away the ML replacement section 812 by removing material from the LTEM 802. In some embodiments, the one or more focused ion beams 808 may comprise a first focused ion beam 808a incident on a first side of the ML replacement section 812 at a first angle $\theta_1$, and a second focused ion beam 808b incident on a second side of the ML replacement section 812 at a second angle $\theta_2$ that is equal to $-\theta_1$ In such embodiments, the severed ML replacement section 812 has a bottom surface comprising a portion of the LTEM 814 with a triangular shape.

Figure 8C:
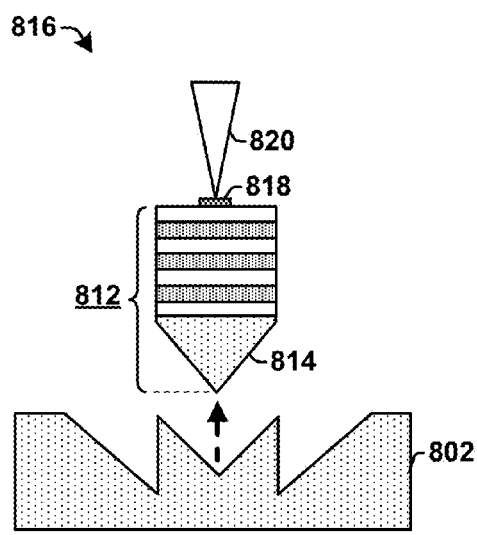

FIG. 8C shows a cross-sectional view 816, in which the severed ML replacement section 812 is lifted by a microprobe 820 from the LTEM 802. In some embodiments, the microprobe 820 may comprise a member used in preparing specimen for a Transmission Electron Microscopy (TEM) or a tip of an atomic force microscope, for example. In some embodiments, an adhesive layer 818 (e.g., CrN) may be positioned between the severed microprobe 820 and the ML replacement section 812.

Figure 8D:
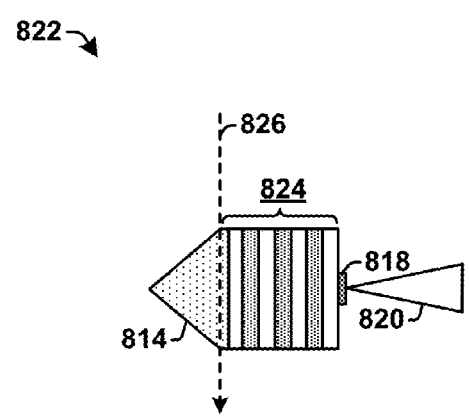

FIG. 8D shows a cross-sectional view 822 the ML replacement section 812 is trimmed to remove a part of the portion of the LTEM 814. Trimming the ML replacement section 808 results in a ML replacement section 824 having a flat bottom surface with a height that allows for the ML replacement section 824 to be vertically aligned with a bottom of a trench defined by the dry etching process. In some embodiments, the ML replacement section 812 may be trimmed using a focused ion beam 826 configured to cut away a part of the portion of the LTEM 814. In other embodiments, ML replacement section 812 may be trimmed using a polishing process.

Figures 9, 10:
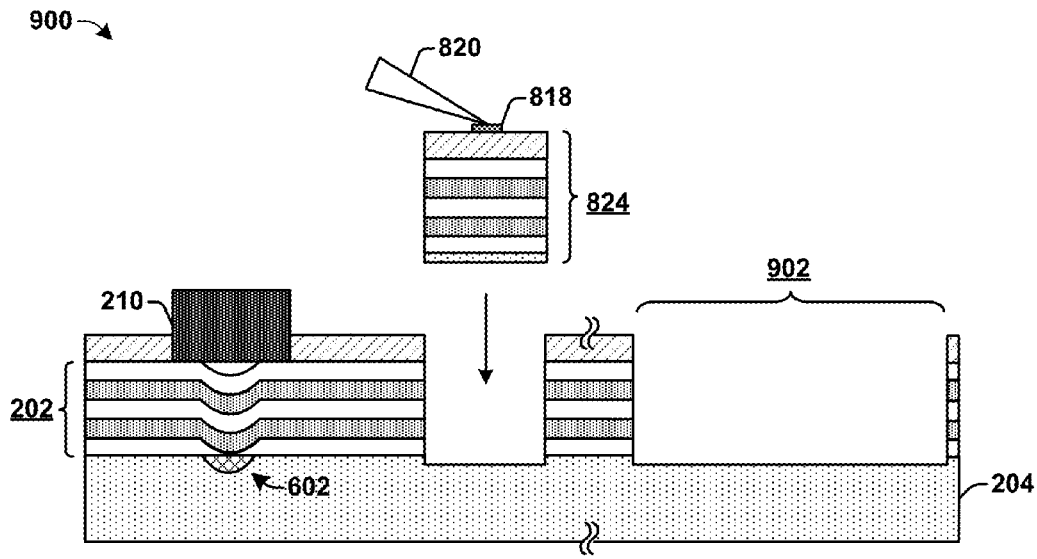
FIG. 10 is a flow diagram of some embodiments of a method for forming an integrated chip feature on a substrate using an EUV mask having mitigated printable native defects.

FIG. 9 illustrates a cross-sectional view 900 of some embodiments of a substrate corresponding to act 510.

As shown in cross-sectional view 900, the ML replacement section 824 is inserted as a plug into the concavity 716 in the EUV mask substrate. In some embodiment, the replacement section 824 may have a smaller diameter than the concavity 716, resulting in a gap between the ML replacement section 824 and the ML reflective coating 202. In such embodiments, analysis results indicate that within a tolerance of several nanometer the gap does not substantially does not affect the reflective feature of the mask repaired with the ML replacement section 824, since the incident area of EUV radiation for reflection on the EUV mask is much smaller than an area of the ML replacement section 824. In various embodiments, the ML replacement section 824 may be various shapes (e.g., square, rectangular, circular, polygonal etc.).

After the plurality of replacement sections 610a . . . 610n are transferred to different concavities 712a . . . 712d within the EUV mask, the replacement section preparation area 806 comprises a trench within the mask substrate that has a width and length greater than a size of the replacement sections.

FIG. 10 is a flow diagram of some embodiments of a method 1000 for forming an integrated chip feature on a substrate using an EUV mask having mitigated native defects.

At 1002, an EUV reticle is provided to an EUV lithography (EUVL) system. The EUV reticle includes an absorber material disposed over a ML reflective coating at position overlying one or more printable defects violating one or more sizing thresholds.

At 1004, a semiconductor substrate is provided to the EUV lithography (EUVL) system. The semiconductor substrate may comprise any type of semiconductor body (e.g., silicon, silicon-germanium, silicon-on-insulator) such as a semiconductor wafer and/or one or more die on a wafer, as well as any other type of semiconductor and/or epitaxial layers associated therewith.

At 1006, the EUVL system is operated to expose photoresist material overlying the semiconductor substrate to EUV radiation (e.g., having wavelengths in a range of between 10 nm and 130 nm) by way of the EUV reticle.

At 1008, the exposed photoresist material is developed. Developing the selectively exposed photoresist material removes weaker sections of the exposed photoresist material, so as to selectively expose the substrate. For example, developing the resist layer removes portions of the resist layer that are exposed to the EUV radiation (or unexposed, depending on the type of the resist layer).

Therefore, the present disclosure relates to a method and apparatus for mitigating printable native defects within an EUV mask substrate.

In some embodiments, the present disclosure relates to a method for mitigating printable native defects in an extreme ultraviolet (EUV) mask substrate. The method comprises providing an EUV mask substrate having a multi-layer reflective coating disposed over a low thermal expansion material. The method further comprises measuring sizes of one or more native defects within the EUV mask substrate and identifying printable native defects having a measured size that violates one or more sizing thresholds. The method further comprises determining a position at which a patterned absorber material is to be formed over the multi-layer reflective coating to minimize a number printable native defects that interact with EUV radiation during an EUV lithography process.

In other embodiments, the present disclosure relates to a method for forming an integrated chip feature. The method comprises providing an EUV reticle to EUV lithography (EUVL) system having absorber material disposed over a multi-layer reflective coating at position overlying one or more printable defects violating one or more sizing thresholds. The method further comprises providing a semiconductor substrate to EUV lithography (EUVL) system, and operating the EUVL system to expose a photoresist material overlying the semiconductor substrate to EUV radiation by way of the EUV reticle.

In yet other embodiments, the present disclosure relates to an extreme ultraviolet (EUV) reticle. The EUV reticle comprises an EUV mask substrate comprising a multi-layer reflective coating comprising a plurality of reflective layers disposed over a low thermal expansion material. The EUV reticle further comprises a patterned absorber material disposed over the multi-layer coating at a position that overlies a maximum number of printable defects that have a size greater than one or more sizing thresholds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for mitigating printable native defects in an extreme ultraviolet (EUV) mask substrate, comprising:
   providing an EUV mask substrate having a multi-layer reflective coating disposed over a material;
   measuring sizes of one or more native defects within the EUV mask substrate;
   identifying printable native defects having a measured size that violates one or more sizing thresholds;
   determining a position at which a patterned absorber material is to be formed over the multi-layer reflective coating to reduce a number of printable native defects that interact with EUV radiation during an EUV lithography process;

identifying a remaining printable native defect that violates the one or more sizing thresholds and that is not prevented from interacting with EUV radiation by the patterned absorber material;

removing a first section of the EUV mask substrate comprising the remaining printable native defect to form a concavity within the EUV mask substrate; and inserting a multi-layer replacement section that is devoid of a printable native defect into the concavity.

2. The method of claim 1, wherein the position at which the patterned absorber material is to be formed minimizes the number of printable native defects, which have a diameter greater than or equal to approximately 150 nm and a height greater than or equal to approximately 20 nm, from interacting with the EUV radiation.

3. The method of claim 1, wherein the position at which the patterned absorber material is to be formed minimizes the number of printable native defects, which are less than 500 nm away from an integrated chip design shape defined by the patterned absorber, from interacting with the EUV radiation.

4. The method of claim 1, further comprising:
preparing the multi-layer replacement section in a replacement section preparation area located outside of the patterned absorber material; and
transplanting the multi-layer replacement section into the concavity.

5. The method of claim 4, wherein removing the first section of the EUV mask substrate comprises:
selectively forming a masking layer over the multi-layer coating to define the first section; and
exposing the EUV mask substrate to a dry etchant configured to etch the multi-layer coating according to the masking layer to remove the first section and form the concavity.

6. The method of claim 4, wherein preparing the multi-layer replacement section, comprises:
selectively forming a masking layer over the multi-layer coating to define the multi-layer replacement section; and
exposing the EUV mask substrate to a dry etchant configured to etch the multi-layer coating according to the masking layer to form a trench around the multi-layer replacement section; and
severing a bottom of the multi-layer replacement section at a position vertically aligned with a bottom of the trench.

7. The method of claim 4, wherein the multi-layer replacement section comprises a plurality of reflective layers disposed over the material.

8. The method of claim 4, wherein a plurality of multi-layer replacement sections are concurrently formed at locations within the EUV mask substrate.

9. The method of claim 1, wherein the first section is removed using a dry etching process to etch the multi-layer reflective coating.

10. A method for forming an integrated chip feature, comprising:
providing an EUV reticle to EUV lithography (EUVL) system having a patterned absorber material disposed over a multi-layer reflective coating at position overlying one or more printable defects violating one or more sizing thresholds;
providing a semiconductor substrate to EUV lithography (EUVL) system;
operating the EUVL system to expose a photoresist material overlying the semiconductor substrate to EUV radiation by way of the EUV reticle; and
wherein the EUV reticle comprises a replacement section preparation area located outside of the patterned absorber material and comprising a trench within the EUV reticle.

11. The method of claim 10, wherein the EUV reticle comprises one or more unprintable native defects that do not violate the one or more sizing thresholds, and which are not covered by the patterned absorber material.

12. The method of claim 10, wherein the one or more sizing thresholds define printable native defects as having a diameter greater than or equal to approximately 150 nm and a height greater than or equal to approximately 20 nm.

13. The method of claim 10, wherein the one or more sizing thresholds define printable native defects as being less than 500 nm away from an integrated chip design shape defined by the patterned absorber material.

14. An extreme ultraviolet (EUV) reticle, comprising:
an EUV mask substrate comprising a multi-layer reflective coating comprising a plurality of reflective layers disposed over a material;
a patterned absorber material disposed over the multi-layer coating at a position that overlies printable defects that have a size greater than one or more sizing thresholds; and
wherein the EUV reticle comprises a replacement section preparation area located outside of the patterned absorber material and comprising a trench within the EUV reticle.

15. The EUV reticle of claim 14, wherein the EUV reticle comprises one or more unprintable native defects that do not violate the one or more sizing thresholds, and which are not covered by the patterned absorber material.

16. The EUV reticle of claim 14, wherein the one or more sizing thresholds define printable native defects as having a diameter greater than or equal to approximately 150 nm and a height greater than or equal to approximately 20 nm.

17. The EUV reticle of claim 14, wherein the one or more sizing thresholds define printable native defects as being less than 500 nm away from an integrated chip design shape defined by the patterned absorber material.

18. The EUV reticle of claim 14, wherein the EUV reticle comprises a replacement section separated from the multi-layer coating by a gap having a size of less than 5 nm.

19. The EUV reticle of claim 14, wherein the EUV reticle comprises a replacement section separated from the multi-layer coating by a gap.

20. The EUV reticle of claim 19, wherein the gap has a size that is greater than a size of the replacement section.

* * * * *